(12) United States Patent
Hasegawa (10) Patent No.: US 7,176,547 B2
(45) Date of Patent: Feb. 13, 2007

(54) SEMICONDUCTOR DEVICE

(75) Inventor: Akihiro Hasegawa, Hashima (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 11/438,068

(22) Filed: May 22, 2006

(65) Prior Publication Data

US 2006/0261429 A1    Nov. 23, 2006

(30) Foreign Application Priority Data

May 23, 2005   (JP)   ............... 2005-149472

(51) Int. Cl.
  *H01L 31/075*   (2006.01)
  *H01L 31/105*   (2006.01)
  *H01L 31/117*   (2006.01)
(52) U.S. Cl. ...................... 257/458; 257/461
(58) Field of Classification Search ........... 257/458, 257/461
See application file for complete search history.

(56) References Cited

U.S. PATENT DOCUMENTS 6,114,740 A * 9/2000 Takimoto et al. ........... 257/461
6,198,146 B1 * 3/2001 Yamamoto et al. ......... 257/458
6,376,871 B1   4/2002 Arai

FOREIGN PATENT DOCUMENTS

JP    A 10-107243    4/1998
JP    A 2001-60713   3/2001

* cited by examiner

*Primary Examiner*—Phat X. Cao
(74) *Attorney, Agent, or Firm*—Oliff & Berridge, PLC

(57) ABSTRACT

A four-division photodetector where a formation process of an element isolation structure is simplified is provided. On a P-sub layer that is a common anode of PIN photodiodes (PIN-PD) for every partition, a high resistivity epitaxial layer that is an i layer of the PIN-PD is grown. At a boundary of the partitions, ion implantation is applied from a substrate surface to form an isolation region that is a $P^+$ region. When a cathode region formed for every partition and the P-sub layer are reverse-biased to operate the PIN-PD, the isolation region is set at a ground potential together with the P-sub layer to operate as an anode. As a result, in the epitaxial layer at a position sandwiched between the isolation region and the P-sub layer, a potential barrier to electrons is formed. As a result, electrons generated owing to light absorption in the respective partitions can be inhibited from moving to adjacent partitions and element isolation can thus be realized.

6 Claims, 7 Drawing Sheets

FIG. 1

(related art)

FIG. 2

(related art)

FIG. 3

(related art)

FIG. 4

(related art)

FIG. 5

(related art)

SEMICONDUCTOR DEVICE

FIELD OF THE INVENTION

The present invention relates to a semiconductor device having a light receiving portion divided into a plurality of partitions each of which is made of a PIN (p-intrinsic-n) photodiode and capable of separately outputting a light receiving signal.

BACKGROUND OF THE INVENTION

In recent years, as an information recording medium, optical disks such as CDs (Compact Disks) and DVDs (Digital Versatile Disks) have become predominant. A reproducing device of the optical disks reproduces recorded data based on a change in intensity of reflected light of laser light irradiated along a track of the optical disk.

Figure 1:
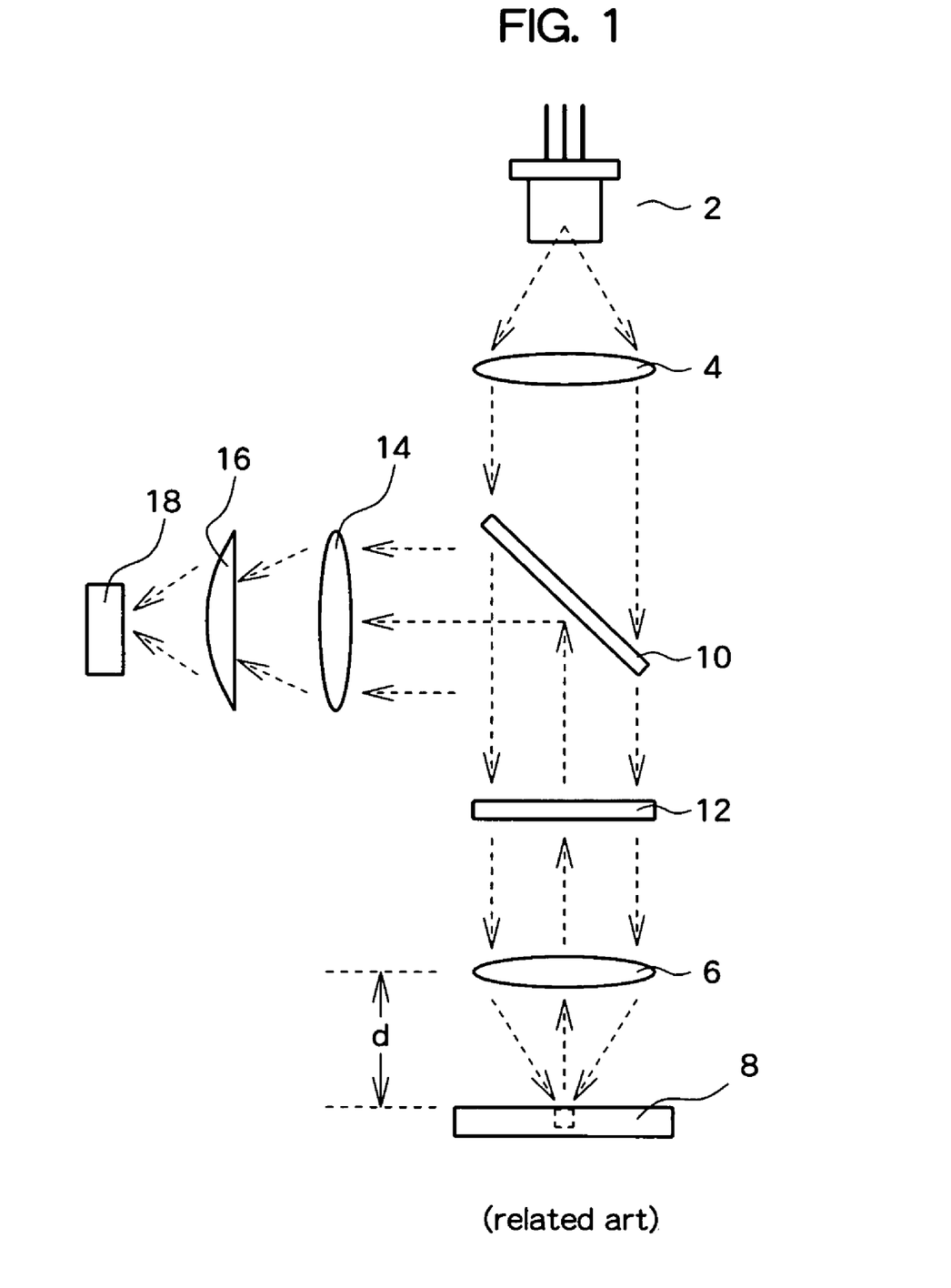
FIG. 1 is a schematic diagram of an optical pickup unit that irradiates laser light and detects reflected light.

FIG. 1 shows a schematic diagram of an optical pickup device that irradiates laser light and detects reflected light. As a laser light source, a semiconductor laser element 2 that is small in size and low in power consumption is used. Laser light exited from the semiconductor laser element 2 is focused on a surface of an optical disk 8 by a collimating lens 4 and an objective lens 6. Focused laser light is irradiated along a track of the optical disk 8 and the optical disk 8 returns reflected light whose intensity changes in accordance with data recorded along the track of the optical disk 8 to the optical pickup device.

A polarization beam splitter 10 disposed on an optical path transmits only a parallel polarization component (p wave) of incident light. Reflected light from the optical disk 8, after transmitting a quarter wave plate 12, together with a rotation by the quarter wave plate 12 at the time of irradiation, rotates by 90° in a polarization plane and enters the polarization beam splitter 10 as a perpendicular polarization component (s wave). The polarization beam splitter 10 reflects reflected light having a rotated polarization plane in a direction different from that of irradiation light. The reflected light separated from the irradiation light by the polarization beam splitter 10 enters a photodetector 18 through a focusing lens 14 and a cylindrical lens 16.

An optical disk reproducing device, while detecting data based on the reflected light, servo-controls a positional relationship between the optical pickup device and the optical disk 8. Specifically, tracking servo control for irradiating the laser light along a centerline of the track and focus servo control for keeping a distance between the optical disk 8 and the optical pickup device constant are carried out. In order to obtain information for such servo control, as the photodetector 18, a semiconductor device receiving a reflected light image divided into a plurality of partitions is used. Furthermore, the cylindrical lens 16 is disposed to carry out the focus servo control.

Incidentally, in the focus servo control, based on an output signal of the photodetector 18, an actuator variably controls a position of the optical pickup device to keep the distance from the optical disk 8 constant. Thereby, an amount of reflected light corresponding to a displacement of a focus of irradiation light on a surface of the optical disk 8 can be suppressed from fluctuating and noise superposed on the light receiving signal corresponding to data can be suppressed.

Figure 2:
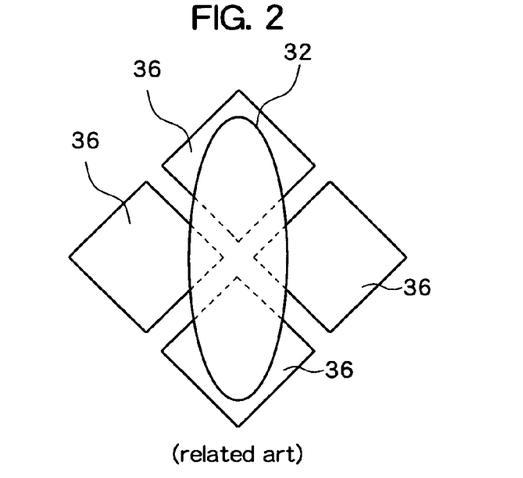
FIG. 2 is a schematic diagram showing an image of reflection light when a light receiving portion of a photodetector and a disk are separated by more than a target distance.
Figure 3:
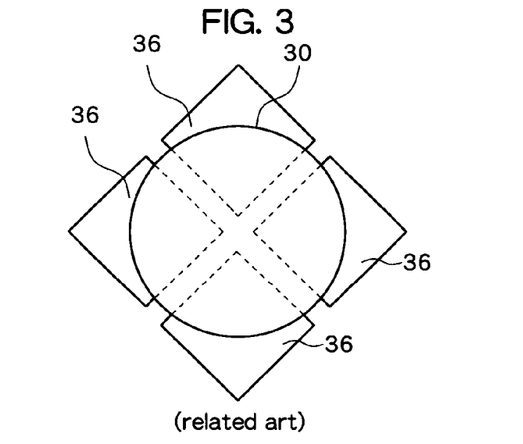
FIG. 3 is a schematic diagram showing an image of reflection light on a light receiving portion when the light receiving portion of a photodetector and a disk are at a target distance.
Figure 4:
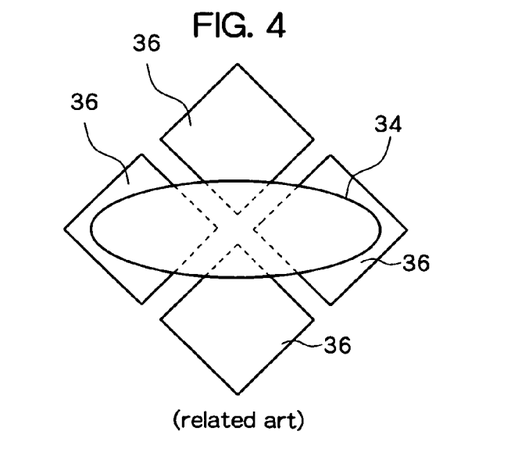
FIG. 4 is a schematic diagram showing an image of reflection light when a light receiving portion of a photodetector and a disk are nearer than a target distance.

FIGS. 2 through 4 are schematic diagrams showing a light receiving portion of the photodetector 18 and a reflection light image on the light receiving portion. According to a principle of an astigmatism method, an image of reflected light past the cylindrical lens 16, in accordance with a distance d between the optical disk 8 and the objective lens 6, varies in a dimensional ratio in two perpendicular directions (in FIG. 1, a vertical direction in a page and a normal direction to the page). Specifically, when a distance d is a target value, as shown in FIG. 3, an image of reflected light is set so as to be a perfect circle 30. For instance, when the distance d is excessive as shown in FIG. 2, an image of reflected light becomes a vertically long ellipse 32 and, on the other hand, when the distance d is insufficient as shown in FIG. 4, an image of reflected light becomes a horizontally long ellipse 34.

The photodetector 18 has a light receiving portion that is divided into 2×2=4 partitions 36 and each of the partitions constitutes a light receiving element that outputs a light receiving signal. The photodetector 18 is arranged so that diagonal directions of a 2×2 square arrangement of the light receiving elements, respectively, may coincide with axes of the vertically long ellipse 32 and the horizontally long ellipse 34. When the photodetector is thus arranged, in FIGS. 2 through 4, based on a difference between a sum of output signals of two light receiving elements arranged on a diagonal line in a vertical direction and a sum of output signals of two light receiving elements arranged on a diagonal line in a horizontal direction, shapes of the respective reflection images can be distinguished and thereby the shape can be used to control distance d.

Figure 5:
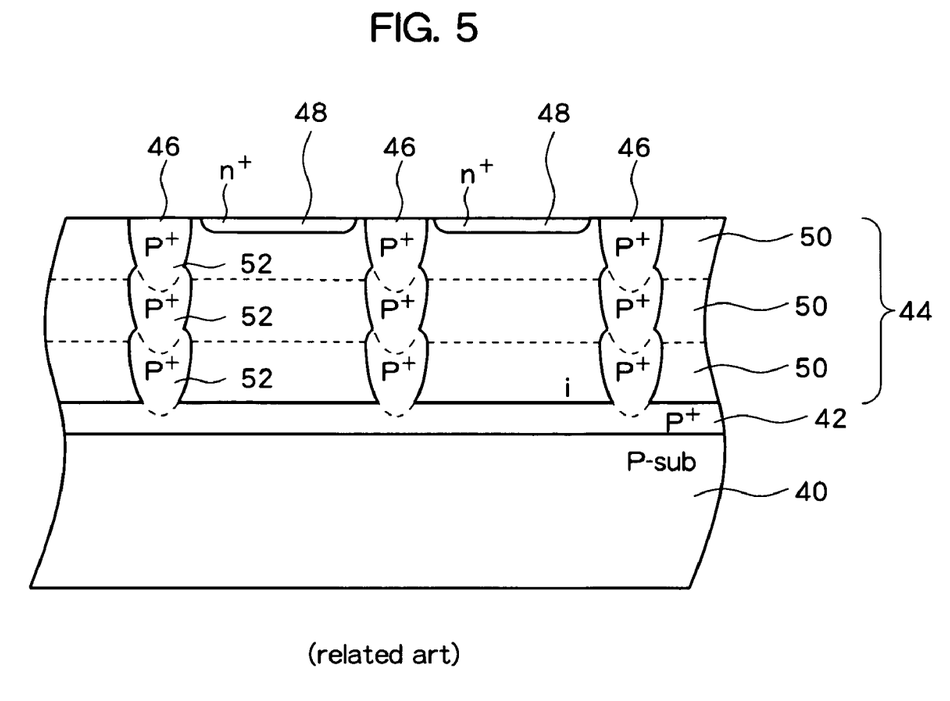
FIG. 5 is a schematic vertical sectional view of an existing photodetector.

Since a data rate read from an optical disk is very high, the photodetector 18 is constituted of a semiconductor device that uses a PIN photodiode high in response speed. FIG. 5 is a schematic sectional view of an existing photodetector 18. The drawing expresses a sectional view that goes through two adjacent light receiving elements and is vertical to a semiconductor substrate. The semiconductor device has a $p^+$ region that becomes an anode region 42, which is formed on a surface of a P-type semiconductor substrate 40. Above the anode region 42, an i layer 44 that is low in impurity concentration and high in resistivity is formed by an epitaxial growth method. In the i layer 44, an isolation region 46 that is made of a $p^+$ region and continues to the anode region 42 is formed at a position corresponding to a boundary of the light receiving element. Furthermore, an $n^+$ region that becomes a cathode region 48 is formed on a surface of the i layer 44.

The anode region 42, the i layer 44 and the cathode region 48 constitute a PIN photodiode that becomes a light receiving element of the photodetector 18. The anode region 42 and the cathode region 48, respectively, are connected to voltage terminals and a reverse bias voltage is applied therebetween. In a reverse bias state, in the i layer 44, a depletion layer is formed and electrons generated in the depletion layer by absorption of incident light move to the cathode region 48 due to an electric field in the depletion layer, followed by being output as a receiving light signal. Here, the isolation region 46, as mentioned above, reaches the anode region 42 from a surface of the i layer 44. Thereby, the i layer 44 is divided for every light receiving element and the crosstalk between light receiving elements can be inhibited.

A thickness of the i layer 44 is set equal to or more than a substantial absorption length of detected light in a semiconductor. For instance, an absorption length of silicon to light of a 780 nm or 650 nm band that is used in a CD or DVD is substantially 10 to 20 μm. The $p^+$ layer of the isolation region 46 is formed by pressing, after the ion implantation, in a depth direction by means of thermal diffusion. At that time, in the thermal diffusion, the $p^+$ region is expanded not only in a depth direction but also in a horizontal direction. In this connection, when the i layer 44 is relatively thick, in order to form an isolation region 46 restricted in a width, the i layer 44 is formed divided into a plurality of times of epitaxial growth. In this case, every time when an epitaxial layer 48 is formed, the ion injection and thermal diffusion are carried out from a surface thereof and as a result an isolation region 52 reaching a bottom surface of the epitaxial layer 48 is formed. When the epitaxial layers 48 and isolation layers 52 are thus layered, the isolation region 46 extending in a depth direction can be formed while suppressing a width.

Thus, when an i layer relatively thick such as 10 to 20 μm is formed, the formation of an epitaxial layer 50 and an isolation layer 52 is repeated a plurality of times. Accordingly, there is a problem in that a semiconductor device that constitutes an existing photodetector 18 becomes high in manufacturing cost. There is another problem in that, for a part of a junction area of the isolation region 46 and the i layer 44, a capacitance between terminals of an anode and a cathode increases and as a result the high-speed responsiveness that is a feature of the PIN photodiode is impaired.

Patent literature 1: JP-A-10-107243
Patent literature 2: JP-A-2001-60713

SUMMARY OF THE INVENTION

The invention provides a semiconductor device capable of reducing the manufacturing cost and having performance suitable as a partitioned photodetector that detects a light signal from an optical disk and so on.

In a semiconductor device according to the invention, a light receiving portion divided into a plurality of partitions is formed on a main surface of a semiconductor substrate. The semiconductor device includes an intermediate semiconductor region disposed on the main surface at a low impurity concentration; a lower semiconductor region that is disposed in contact with a bottom surface of the intermediate semiconductor region, to which a first voltage is applied and that has a first conductivity type at an impurity concentration higher than the intermediate semiconductor region; a boundary semiconductor region that is formed on a surface of the intermediate semiconductor region along a boundary between the partitions, to which a second voltage is applied and that has the first conductivity type at an impurity concentration higher than the intermediate semiconductor region; and a plurality of upper semiconductor regions each of which is formed at a position corresponding to each of the partitions on a surface of the intermediate semiconductor region, to which a third voltage is applied and that has a second conductivity type at an impurity concentration higher than the intermediate semiconductor region. In the above, each of the upper semiconductor regions and the lower semiconductor region are made in a reverse bias state owing to the first voltage and the third voltage to form a depletion region in the intermediate semiconductor region, and the boundary semiconductor region and the lower semiconductor region, in accordance with the second voltage, form a potential barrier against a movement of the signal electric charges between the partitions.

DESCRIPTION OF THE PREFERRED EMBODIMENTS

In what follows, modes for carrying out the invention (hereinafter, referred to as embodiments) will be described with reference to the drawings.

Embodiment 1

Figure 6:
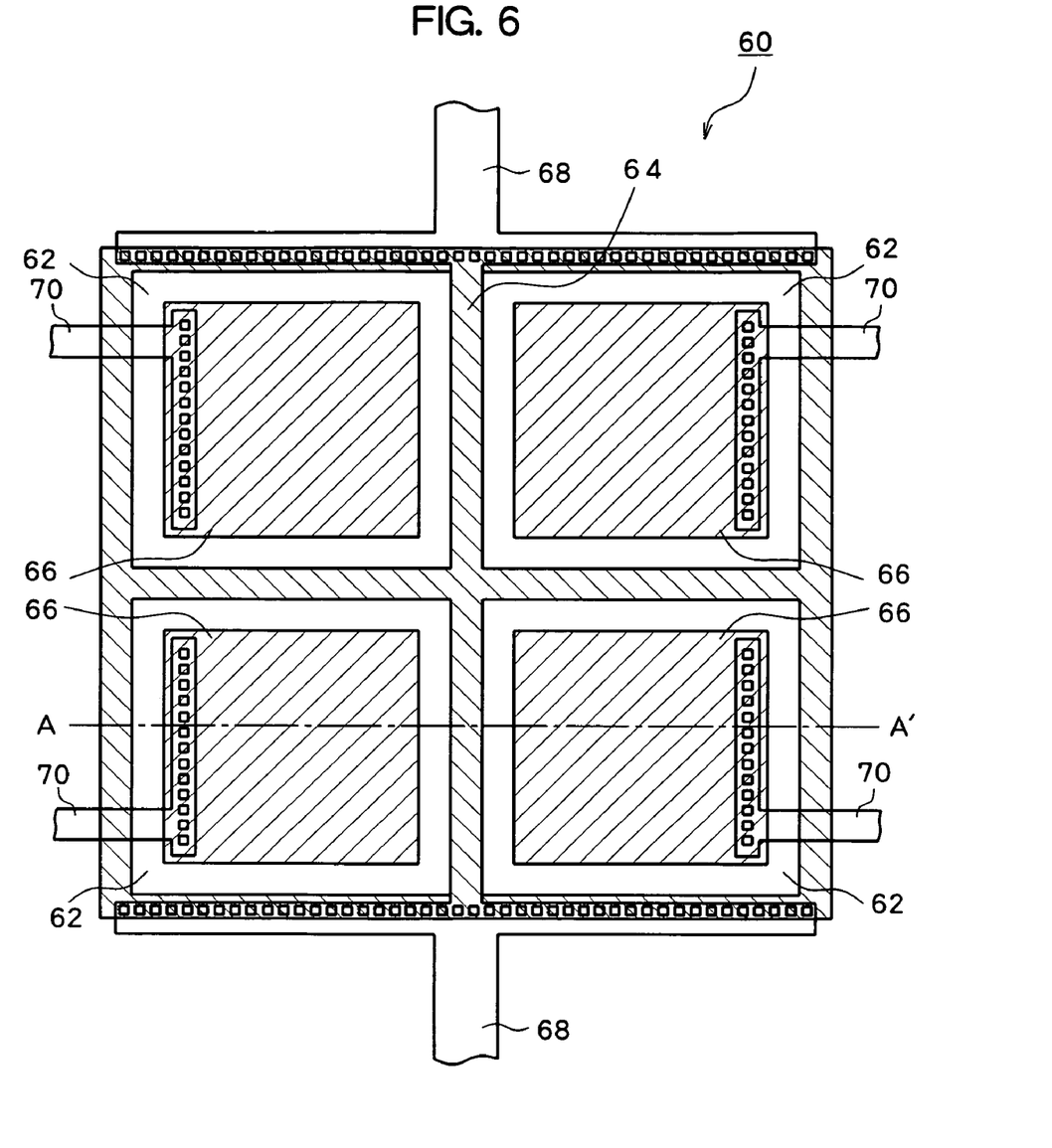
FIG. 6 is a schematic plan view of a photodetector that is a semiconductor device according to an embodiment.

FIG. 6 is a schematic plan view of a photodetector that is a semiconductor element according to the embodiment. A photodetector 60 is formed on a semiconductor substrate made of silicon. In a passivation film (not shown in the drawing) layered on a surface of a semiconductor substrate, an opening is formed corresponding to a light receiving portion. The light receiving portion receives light that goes through the opening to enter a surface of the substrate divided into 2×2=4 partitions 62.

Each of the partitions 62 is partitioned with an isolation region 64 (boundary semiconductor region) formed on a surface of a semiconductor substrate in the periphery thereof. The isolation region 64 is formed as, for instance, a $p^+$ region where a P type impurity is diffused at a high concentration. In a portion corresponding to a light receiving portion of the silicon substrate, light is absorbed, thereby generating electrons and holes. On each of the partitions 62, as a cathode of a PIN photodiode, a cathode region 66 (upper semiconductor region) that collects electrons of generated electric charges is disposed. The cathode region 66 is formed as, for instance, an $n^+$ region where an N type impurity is diffused at a high concentration.

The isolation region 64 and the respective cathode regions 66, respectively, are connected through a contact to wiring formed by, for instance, an aluminum (Al) layer. To the isolation region 64, for instance, a ground potential is applied by wiring 68. Furthermore, signal electric charges collected in each of the cathode regions 66 are read through wiring 70.

Figure 7:
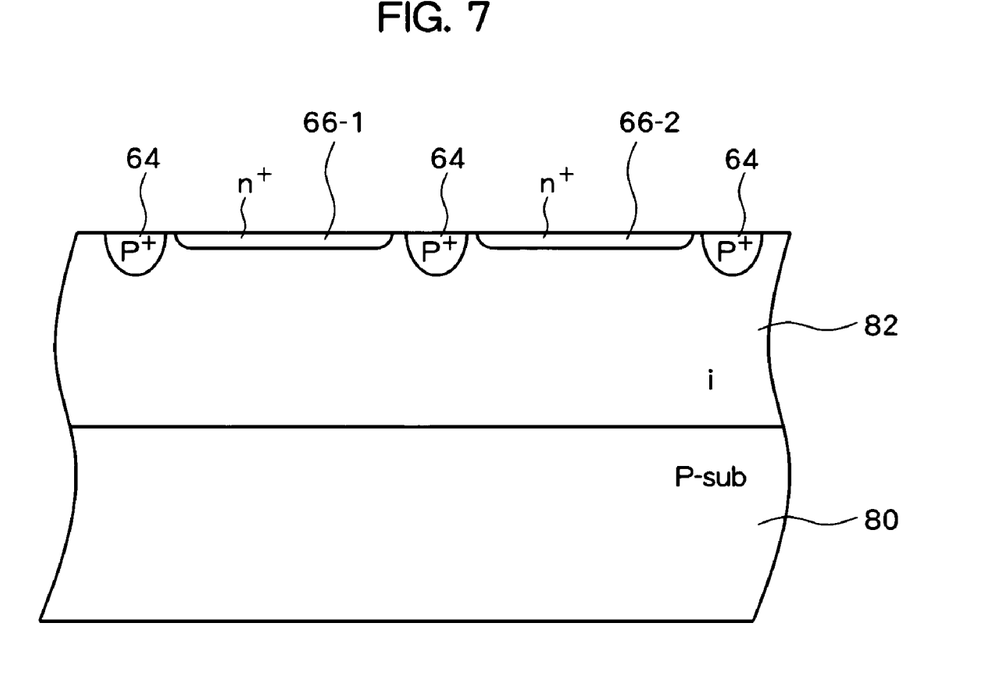
FIG. 7 is a schematic vertical sectional view showing a structure of a light receiving portion according to a first embodiment.

FIG. 7 is a schematic sectional view showing a structure of a light receiving portion in a section that goes through a straight line A–A' shown in FIG. 6 and is vertical to the semiconductor substrate. The photodetector 60 is formed with the use of a semiconductor substrate which is constituted with a P-sub layer 80 (lower semiconductor region) and a semiconductor layer that is laminated on one main surface of the P-sub layer 80. The P-sub layer 80 is a P type silicon substrate into which a P type impurity is introduced. The semiconductor layer laminated on the P-sub layer 80 is lower in impurity concentration than the P-sub layer 80 and has high resistivity. The P-sub layer 80 becomes an anode of the PIN photodiode. The high resistivity semiconductor layer formed thereon is formed according to, for instance, an epitaxial growth method. The epitaxial layer 82 constitutes an i layer (intermediate semiconductor region) of the PIN photodiode. The low concentration impurity introduced in the epitaxial layer 82 is, for instance, a P type impurity. On a surface of the epitaxial layer 82, the foregoing isolation region 64 and the cathode region 66 are formed.

Now, since a silicon substrate on which an epitaxial layer 82 is formed is provided from semiconductor substrate manufacturers, the present photodetector 60 can be manufactured therewith. The ion implantation is applied to each of the isolation region 64 and the cathode region 66 to introduce an impurity therein. In order to carry out the respective ion implantations, on a surface of a silicon substrate on which the epitaxial layer 82 is formed, a mask is formed by means of a photolithography method. After the formation of the mask, the ion implantation is carried out, and thereby an impurity is selectively introduced in a target region.

The impurities respectively introduced by the ion implantation method in positions where the isolation region 64 and the cathode region 66 of the substrate are formed are, as needs arise, further subjected to a thermal diffusion process to press in a depth direction of the substrate. A pressing amount thereof is controlled separately to the isolation region 64 and the cathode region 66. For instance, the isolation region 64, as will be described below, has a function of suppressing the crosstalk between partitions 62 of signal electric charges collected in the respective cathode regions 66. In this connection, a depth of the isolation region 64 can be set deeper than, for instance, the cathode region 66. On the other hand, when the depth of the cathode region 66 is formed shallower, a depletion layer formed in the i layer therebelow expands from the vicinity of a substrate surface, and as a result an improvement in the photoelectric conversion efficiency can be expected. When the cathode region 66 is formed shallower than the isolation region 64, the ion implantation and the thermal diffusion of the impurity to the isolation region 64 are preferably carried out prior to the ion implantation to the cathode region 66.

As mentioned above, a thickness of the epitaxial layer 82 that constitutes the i layer is set to around or more than an absorption length in the semiconductor of light that is detected. The absorption length of silicon to light of 780 nm or 650 nm band, which is used, for instance, in a CD or DVD, is substantially 10 to 20 µm. The thickness is larger than the depth of the isolation region 64. That is, in a configuration of the photodetector 60, the isolation region 64 does not reach the P-sub layer 80, that is, between the isolation region 64 and the P-sub layer 80, an epitaxial layer 82 having high resistivity is present as an i layer.

As mentioned above, the P-sub layer 80 is used as an anode of the PIN photodiode. That is, the P-sub layer 80, with a ground voltage applied from, for instance, a back surface of the substrate, functions as an anode. Here, the isolation region 64, as mentioned above, with a ground potential applied from wiring 68 disposed on a substrate surface side, constitutes an anode together with the P-sub layer 80.

Figure 8:
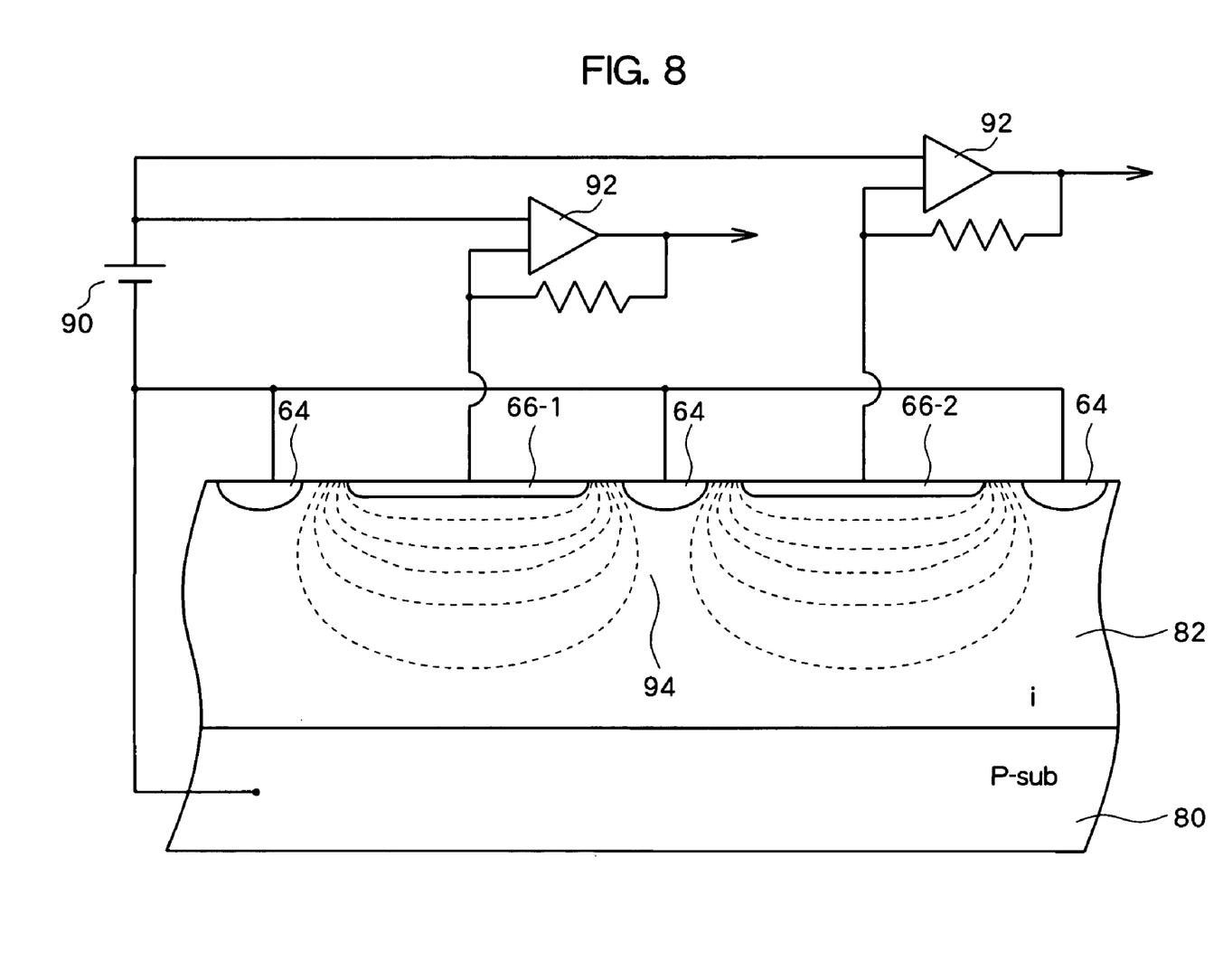
FIG. 8 is a schematic diagram showing a circuit configuration at the time of an operation of a photodetector and a potential distribution in a vertical section.

Next, an operation of the photodetector 60 will be described. FIG. 8 is a schematic diagram showing a circuit configuration when the photodetector 60 is in operation and a potential distribution in a device section corresponding to FIG. 7. The cathode region 66 is rendered, by means of a voltage source 90, in a reverse bias state to the isolation region 64 and P-sub region 80 that are set at a ground potential. Specifically, wiring (wiring 70 shown in FIG. 6) from each of the cathode regions 66 is connected to one input terminal of an operational amplifier 92 and a positive voltage Vb from the voltage source 90 is inputted to the other terminal of the operational amplifier 92. An output terminal of the operational amplifier 92 is connected through a resistance to the cathode region 66 to form a current detector. According to the configuration, Vb is applied to the cathode region 66 and a voltage corresponding to the cathode current can be extracted at an output terminal of the operational amplifier 92.

In a section of an element shown in FIG. 8, some isopotential lines are shown with dotted lines. The sectional view shows that when a reverse bias voltage is applied between an anode and a cathode of a PIN photodiode a depletion layer expands in an epitaxial layer 82 that constitutes an i layer. The closer to the cathode region 66 a potential is, the deeper, that is, the higher, the potential is, and thereby a potential well to electrons is formed with each of the cathode regions 66 as a center. When both of the isolation region 64 and the P-sub layer 80 are reverse-biased against the cathode region 66 by applying a ground potential, a potential of a boundary region 94 between the isolation region 64 and the P-sub region 80 of the epitaxial layer 82 becomes shallower. That is, in addition to the P-sub layer 80, in the isolation region 64 as well, by applying a ground potential as an anode, a potential of the boundary region 94 below the isolation region 64 is dragged in a direction of becoming shallower in potential. As a result, a potential barrier to movement of electrons is formed between potential wells corresponding to the respective partitions 62 adjacent with the isolation region 64 interposed therebetween.

For instance, while electrons generated in the i layer below a cathode region 66-1 on a left side owing to light incident on a partition 62 on a left side in FIG. 7 or 8 can readily move along an electric field of a potential well generated in a left side region to the cathode region 66-1, they cannot readily move to a cathode region 66-2 on a right side because of the presence of the potential barrier in the region 94. Accordingly, signal charges corresponding to light incident on the partition 62 on a left side are collected solely in the cathode region 66-1. Similarly, it is difficult for signal charges corresponding to light incident on the partition 62 on a right side to move to the cathode region 66-1 because of the presence of the potential barrier and solely collected in the cathode region 66-2. An amount of electrons collected in each of the cathode regions 66 is detected as a cathode current through an operational amplifier 92.

In a configuration of the photodetector 60, as mentioned above, in addition to the P-sub layer 80, the isolation region 64 is made an anode. Therefore, irrespective of the i layers of adjacent partitions 62 continuing below the isolation region 64, element isolation is realized between adjacent PIN photodiodes disposed for each of the partitions 62. A light receiving signal in which the crosstalk is suppressed can thus be obtained for every partition 62.

As one technology for element isolation, a LOCOS (local oxidation of silicon) method is known. According to this technology, for instance, on a top surface of the $p^+$ region such as that formed in the isolation region 64, a thick oxide film embedded in a substrate is selectively grown. This technology can also be applied in the photodetector 60, but is not adopted in this embodiment.

In a configuration where a LOCOS oxide film is not formed on the isolation region 64 like in the embodiment, light incident from above the isolation region 64 is not attenuated owing to the LOCOS oxide film. In the photodetector 60, there is an i layer below the isolation region 64 and it can be depleted. Accordingly, light incident from above the isolation region 64 with the attenuation suppressed can reach the i layer below the isolation region 64 to generate signal electric charges. As a result, the detection efficiency to light incident to a light receiving portion can be improved.

Furthermore, the isolation region 64 can be a region insensitive to the incident light detection. Here, since the LOCOS oxide film is not formed, the isolation region 64 can be avoided, in the formation process, from diffusing in a horizontal direction. As a result, since a ratio of the isolation region 64 in the light receiving portion can be suppressed, the detection efficiency to light incident to a light receiving portion can be improved in this point as well.

Embodiment 2

Figure 9:
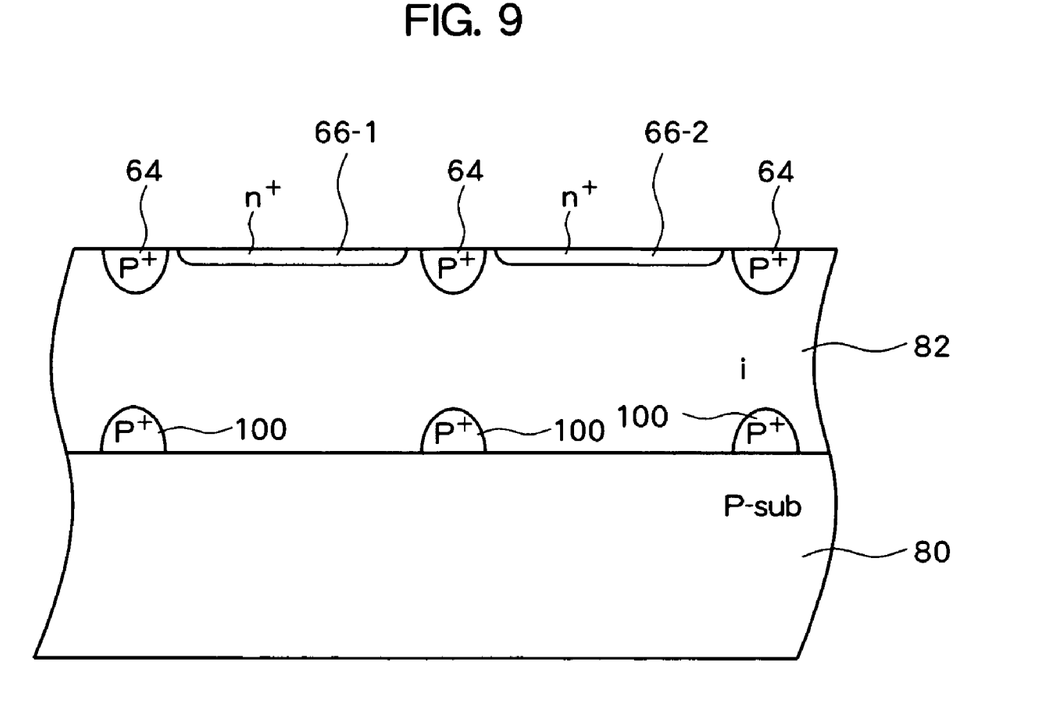
FIG. 9 is a schematic vertical sectional view showing a structure of a light receiving portion according to a second embodiment.

A photodetector 60 according to a second embodiment is characterized in a sectional structure in a vertical direction of a substrate. That is, a plan structure thereof can be made similar to, for instance, that of the first embodiment, and FIG. 6 is adopted here. FIG. 9 is a schematic sectional view that shows a structure of a light receiving portion of the second embodiment in a section that goes through a straight line A–A' shown in FIG. 6 and is vertical to a semiconductor substrate. In the embodiment, constituent elements that are the same as those in the first embodiment are given the same reference numerals and descriptions thereof will be simplified. The photodetector 60 has a lower isolation region 100 that is a p$^+$ region protruded from a P-sub layer 80 at a position opposite to the isolation region 64.

The lower isolation region 100, under a voltage applied to the P-sub layer 80, functions as an anode on a substrate side together with the P-sub layer 80. Owing to the lower isolation region 100, a distance between an anode that the isolation region 64 constitutes and an anode on a substrate side is narrowed at a boundary of the partition 62, and as a result, in an epitaxial layer 82 therebetween, a potential barrier to electrons is more preferably formed than in the first embodiment. Accordingly, the element isolation performance between the partitions 62 can be improved.

For instance, the lower isolation region 100 can be formed in such a manner that, in a stage where a part of thickness of the epitaxial layer 82 is layered on the P-sub layer 80, on a position corresponding to a boundary of partitions 62 of the epitaxial layer 82, a P type impurity is introduced by means of an ion implantation method. After the lower isolation region 100 is thus formed, a remaining thickness of the epitaxial layer 82 is grown, followed by forming a structure such as an isolation region 64 and a cathode region 66 on a substrate surface similarly to the first embodiment.

A semiconductor device according to the invention, which was described with a photodetector 60, has a light receiving portion divided into a plurality of partitions on a main surface of a semiconductor substrate. The semiconductor device includes an intermediate semiconductor region disposed on the main surface and having a low impurity concentration; a lower semiconductor region that is disposed in contact with a bottom surface of the intermediate semiconductor region, to which a first voltage is applied and that has a first conductivity type at an impurity concentration higher than the intermediate semiconductor region; a boundary semiconductor region that is formed on a surface of the intermediate semiconductor region along a boundary between the adjacent partitions, to which a second voltage is applied and that has the first conductivity type at an impurity concentration higher than the intermediate semiconductor region; and a plurality of upper semiconductor regions each of which is formed at a position corresponding to each of the partitions on a surface of the intermediate semiconductor region, to which a third voltage is applied and that has a second conductivity type at an impurity concentration higher than the intermediate semiconductor region. Each of the upper semiconductor regions and the lower semiconductor region are made in a reversed bias state owing to the first voltage and the third voltage to form a depletion region in the intermediate semiconductor region. The boundary semiconductor region and the lower semiconductor region, in accordance with the second voltage, form a potential barrier therebetween against a movement of the signal electric charges between the partitions.

In another semiconductor device according to the invention, as shown in the second embodiment, the lower semiconductor region has a convex portion protruding upward at a position facing the boundary semiconductor region.

The intermediate semiconductor region can be made the first conductivity type. A depth of the upper semiconductor region can be set shallower than a depth of the boundary semiconductor region. The intermediate semiconductor region can be formed of an epitaxial growth layer.

Furthermore, the semiconductor device according to the invention can be constituted so that signal light can enter on a surface of the boundary semiconductor region. As an example thereof, in the embodiment, a configuration where a LOCOS oxide film is not formed on the isolation region 64 was shown.

According to the above-described invention, a boundary semiconductor region disposed at a boundary to isolate adjacent partitions that become a light receiving element is formed after an intermediate semiconductor region that becomes an i layer is completed. Accordingly, manufacturing cost can be suppressed. The boundary semiconductor region reaches only to a part of a depth thereof from a surface of the intermediate semiconductor region and of the boundary portion of the partitions between the boundary semiconductor region and the lower semiconductor region the intermediate semiconductor region is present. The intermediate semiconductor region of the boundary portion, when a voltage that becomes a reverse bias to the upper semiconductor region is applied to both of the boundary semiconductor region and the lower semiconductor region, becomes a potential barrier to signal electric charges that gather in the upper semiconductor region. As a result, the crosstalk between partitions can be suppressed. Furthermore, since the boundary semiconductor region is only partially formed in a depth of the intermediate semiconductor region, capacitances between terminals of the boundary semiconductor region and the lower semiconductor region and terminals of the upper semiconductor regions can be suppressed making it possible to achieve a high-speed response. Furthermore, since the intermediate semiconductor region of the boundary portion can also be supplied for the photoelectric conversion, the conversion efficiency can be improved. Still further, when the photodetector is constituted so that light can enter on a surface of the boundary semiconductor region, the light transmits the boundary semiconductor region and enters the intermediate semiconductor region of the boundary portion, followed by photoelectrical conversion. That is, the semiconductor device according to the invention has sensitivity even to light entering in the boundary portion of the partitions and as a result the detection loss at the boundary portion can be suppressed. Accordingly, an optical image extending over a plurality of partitions can be detected precisely divided across the respective partitions.

What is claimed is:

1. A semiconductor device where a light receiving portion divided into a plurality of partitions is formed on a main surface of a semiconductor substrate comprising:
    an intermediate semiconductor region that is disposed on the main surface and has a low impurity concentration;
    a lower semiconductor region that is disposed in contact with a bottom surface of the intermediate semiconductor region, to which a first voltage is applied and that has a first conductivity type at an impurity concentration higher than the intermediate semiconductor region;
    a boundary semiconductor region that is formed on a surface of the intermediate semiconductor region along a boundary between the partitions, to which a second voltage is applied and that has the first conductivity type at an impurity concentration higher than the intermediate semiconductor region; and
    a plurality of upper semiconductor regions each of which is formed at a position corresponding to each of the partitions on a surface of the intermediate semiconductor region, to which a third voltage is applied and that has a second conductivity type at an impurity concentration higher than the intermediate semiconductor region,
    wherein each of the upper semiconductor regions and the lower semiconductor region are made in a reverse bias state owing to the first voltage and the third voltage to form a depletion layer in the intermediate semiconductor region; and
    the boundary semiconductor region and the lower semiconductor region, in accordance with the second voltage and the first voltage, form a potential barrier against a movement of the signal electric charges between the partitions.

2. The semiconductor device according to claim 1, wherein the lower semiconductor region has a convex portion protruded upward at a position facing the boundary semiconductor region.

3. The semiconductor device according to claim 1, wherein the intermediate semiconductor region is the first conductivity type.

4. The semiconductor device according to claim 1, wherein a depth of the upper semiconductor region is shallower than that of the boundary semiconductor region.

5. The semiconductor device according to claim 1, wherein signal light is capable of entering on a surface of the boundary semiconductor region.

6. The semiconductor device according to claim 1, wherein the intermediate semiconductor region is an epitaxial growth layer.

* * * * *